(12) United States Patent
Su et al.

(10) Patent No.: US 6,346,896 B1
(45) Date of Patent: Feb. 12, 2002

(54) DECODING APPARATUS AND METHOD FOR DEINTERLEAVING DATA

(75) Inventors: Wei-Ming Su; Shin Yung Chen, both of Taipei (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 09/455,722

(22) Filed: Dec. 6, 1999

(30) Foreign Application Priority Data

Apr. 8, 1999 (TW) .............................. 88105564

(51) Int. Cl.[7] .............................. H03M 7/00
(52) U.S. Cl. .............................. 341/81; 714/752
(58) Field of Search .............................. 341/81; 375/250; 714/752

(56) References Cited

U.S. PATENT DOCUMENTS

| | | | | |
|---|---|---|---|---|
| 4,394,642 A | * | 7/1983 | Currie et al. .............. | 341/81 |
| 4,875,189 A | * | 10/1989 | Obara .............. | 341/81 |
| 5,056,105 A | * | 10/1991 | Darmon et al. .............. | 341/81 |
| 5,386,249 A | * | 1/1995 | Strolle et al. .............. | 348/701 |
| 5,555,197 A | * | 9/1996 | Ninomiya et al. .......... | 348/571 |
| 5,596,540 A | * | 1/1997 | Diem et al. .............. | 365/221 |
| 5,799,033 A | * | 8/1998 | Baggen .............. | 341/81 |
| 5,940,863 A | * | 8/1999 | Fimoff et al. .............. | 711/157 |

* cited by examiner

*Primary Examiner*—Peguy Jeanpierre
*Assistant Examiner*—Jean Bruner Jeanglaude
(74) *Attorney, Agent, or Firm*—Rabin & Berdo, P.C

(57) ABSTRACT

A decoding device for deinterleaving data includes a write address generator, a read address generator, and a memory device. According to a method for deinterleaving data, the write address generator generates a write address according to parameters corresponding to the interleaving characteristics of an input signal. The write addresses are offset according to the parameters in order to apply a deinterleaving function to the input data. The read address generator generates a read address so as to sequentially read the stored data, to provide deinterleaved output data.

30 Claims, 5 Drawing Sheets

DECODING APPARATUS AND METHOD FOR DEINTERLEAVING DATA

BACKGROUND OF THE INVENTION

This application incorporates by reference Taiwanese application Ser. No. 88105564, filed Apr. 8, 1999.

1. Field of the Invention

The invention relates in general to a signal-decoding device and a decoding method, and more particularly to a device and method for deinterleaving data stored on disks.

2. Description of the Related Art

It is sometimes possible that a compact disk (CD) may suffer from physical damage, for example, scratches, during production or use. To prevent logical continuous data from being lost as a result of the physical damage, a data scramble technique is typically employed during the data-write process of CD read-only-memory (CD-ROM) production. In short, each logical continuous data stream is first divided into a plurality of blocks according to a predetermined algorithm. Afterwards, another algorithm is employed to scramble blocks of one logical continuous data stream with blocks of other logical continuous data streams. The resulting scrambled data are then sequentially and continuously written into the physical spaces of the CD-ROM. When, unfortunately, a certain portion of the CD-ROM is damaged, the portion of damaged data belonging to one logical continuous data stream may be recovered by the associated un-damaged data of the respective logical continuous data stream via the algorithm. Therefore, in addition to the raw data, some extra data, including control code, sync code, and protection code are added to the raw data to form the complete data in the CD-ROM.

In order to prevent data damage or loss, when original data are to be stored in disks, the following encoding operations are sequentially performed: C3 encoding, C2 encoding, interleaving, and C1 encoding.

The interleaving operation repartitions frames of C2 coded data into different frames for C1 coding. After interleaving, if data is damaged, the damaged data is dispersed among different frames of the decoded data, and thus correction probability is enhanced.

Therefore, when data in a disk is read, the following decoding operations are sequentially performed: C1 decoding, deinterleaving, C2 decoding, and C3 decoding. Deinterleaving is a reverse operation of interleaving.

Referring to FIG. 1, which shows a conventional deinterleaving operation. Each frame of C1 coded data includes 32 bytes, in which there are 4 bytes of parity check. After C1 coded data is parity-checked by the 4 parity bytes, 28 bytes of parity-checked C1 coded data are obtained.

As shown, in FIG. 1, a first byte (byte 0) of the parity-checked C1 coded data is delayed for 27×4=108 cycles and then provided to a C2 decoder. A cycle represents a transmission unit of a frame. Similarly, a second byte (byte 1) of the parity-checked C1 coded data is delayed for 26×4=104 cycles and then provided to the C2 decoder. Byte 2 of the parity-checked C1 coded data is delayed for 25×4=100 cycles and then provided to the C2 decoder. The relation is summarized as follows: byte k is delayed for (27−k)×4 cycles and then provided to the C2 decoder. Thus, byte 27 of the parity-checked C1 coded data is delayed for 0×4=0 cycles and then provided to the C2 decoder Each byte of the parity-checked C1 coded data is transmitted to the C2 decorder in pipeline mode. Between each byte received by the C2 decoder, there is a 4-frame transmission cycle delay.

That is to say, byte 0 of a first C2 frame received by the C2 decoder comes from byte 0 of the first C1 frame. Byte 1 of the first C2 frame comes from byte 1 of a fifth C1 frame. Byte 2 of the first C2 frame comes from byte 2 of a ninth C1 frame.

A symbol "D" in FIG. 1 represents delay registers. Each delay register is used to delay bytes of the C1 frame for one cycle. That is to say, in FIG. 1, there are 108, 104, . . . , 4, 0 delay registers used for delaying bytes 0, 1, . . . 27 of the C1 and C2 coders.

However, a disadvantage of this conventional scheme is that it uses a large number of delay registers. As shown in FIG. 1, it is clear that such a conventional system requires 108+104+ . . . +4+0=1512 delay registers to implement the deinterleaving process. The number of logic gates used for implementing so many delay registers is 44 k in total.

Therefore, according to the conventional system, a deinterleaving device is very complicated because 44 k logic gates are used. Circuit designers must take a great deal of time to design and debug such a system. The total cost for providing this large number of gates and testing the final design is high.

SUMMARY OF THE INVENTION

It is therefore an object of the invention to provide an improved and simplified device and method for deinterleaving data, for example during signal-decoding. By applying the present invention, the hardware cost can be reduced, and the circuit designer can design and debug the circuit more easily.

The invention achieves the above-identified objects by providing a method of deinterleaving bytes of a framed input signal to provide a deinterleaved framed output signal. The method includes: generating a write address A1; receiving sequential bytes of the input signal; storing the received bytes as write data according to the write address A1; generating a read address A2; and producing the output signal as sequential bytes of read data according to the read address A2. Generating a write address A1 includes: setting initial values of input parameters which correspond to characteristics of a current received byte; generating an initial write address based on the initial values of the input parameters; changing the values of ones of the input parameters to correspond to a next received byte; and repeatedly generating the write address A1 based on the changed values of the input parameters. Storing the received bytes as write data includes sequentially writing each of the received bytes to a respective memory address corresponding to the write address A1. Generating a read address A2 includes: setting initial value of output parameter which corresponds to characteristics of a current byte of read data; generating an initial read address based on the initial value of the output parameter; changing the value of the output parameter after each byte of read data is provided; and repeatedly generating the read address A2 based on the changed value of the output parameter. Providing the output signal as bytes of read data includes reading sequential bytes of the read data from a memory address corresponding to the read address A2. The invention is particularly applicable where the input signal is a parity-checked C1-coded signal having a 28-byte frame, and the output signal is a C2-coded signal having a 28-byte frame.

Preferably, the input parameters include a first input parameter I1, a second input parameter K1, and a third input parameter D. The first input parameter I1 corresponds to a frame identification of a current received byte. The second input parameter K1 corresponds to a byte identification of the current received byte. The third input parameter D corresponds to a delay identification of the current received byte. Likewise, the output parameters preferably include a output parameter I2. The output parameter I2 corresponds to a frame identification of a current byte of read data. Accordingly, an initial value of the first input parameter I1 corresponds to the number of frames in the input signal. An initial value of the second input parameter K1 corresponds to the first byte of the input signal. An initial value of the third input parameter D corresponds to an initial interleave delay between bytes in a frame of the input signal.

Further, changing the values of ones of the input parameters to correspond to a next received byte includes changing the parameters such that K1=K1+1 and D=D+N if K1<B.

The "N" corresponds to a number of clock cycle interleave delay units between bytes of the input signal. The "B" corresponds to a number of bytes in a frame of the input signal. When K1=B, the parameters I1, K1 and D are then changed. The first input parameter I1 is incremented. The second input parameter K1 is reset to its initial value. The third input parameter D is reset to its initial value.

Likewise, an initial value of the first output parameter I2 corresponds to a number that is 1 greater than the number of frames in the output signal. Generating the read address A2 includes accessing a memory location corresponding to A2=I2*B−1, wherein B corresponds to a number of bytes in a frame of the output signal. Changing the value of the output parameters to correspond to a next byte of read data includes changing the parameter such that I2=I2+1.

A method of deinterleaving bytes of a framed input signal to provide a deinterleaved framed output signal according to a particular preferred embodiment includes: generating a write address A1; storing the input signal as bytes of write data according to the write address A1; generating a read address A2; and providing the output signal as bytes of read data according to the read address A2. The write address A1 corresponds to three parameters-an input frame parameter I1, an input byte parameter K1, and a row difference parameter D. These three parameters have their own initial values. After each byte of write data is stored, the values of ones of the input frame parameter I1, the input byte parameter K1, and the row difference parameter D are changed. The write address A1 are repeatedly generated based on the changed values of the input frame parameter I1, the input byte parameter K1, and the row difference parameter D. Storing the input signal as bytes of write data includes writing sequential bytes of the input signal to a memory address corresponding to the write address A1. The read address A2 has an initial value. An initial read address A2 is generated based on the initial value of the output frame parameter I2. After each byte of read data is provided, the value of the output frame parameter I2 is changed. The read address A2 is repeatedly generated based on the changed value of the output frame parameter I2. Providing the output signal as bytes of read data includes reading sequential bytes of the read data from a memory address corresponding to the read address A2. The invention is particularly applicable where the input signal is a parity-checked C1-coded signal having a 28-byte frame, and the output signal is a C2-coded signal having a 28-byte frame. Writing sequential bytes of the input signal to a memory address includes writing to an array memory, which is preferably a 4Kbyte SRAM. Preferably, the initial value of the input frame parameter I1 is 108, the initial value of the row difference parameter D is 0, and the initial value of the input byte parameter K1 is 0.

Further, changing the values of ones of the input parameters to correspond to a next received byte includes changing the parameters such that K1=K1+1 and D=D+4 if K1<28. When K1=28, the parameters I1, K1 and D are then changed. The first input parameter I1 is incremented by 1. The second input parameter K1 is reset to its initial value. The third input parameter D is reset to its initial value.

Likewise, an initial value of the first output parameter I2 corresponds to a number that is 1 greater than the number of frames in the output signal. Generating the read address A2 includes accessing a memory location corresponding to A2=I2*B−1, wherein B corresponds to a number of bytes in a frame of the output signal. Changing the value of the output parameters to correspond to a next byte of read data includes changing the parameter such that I2=I2+1.

A decoding device for deinterleaving bytes of framed input data according to the invention includes a memory device that stores the input data and provides output data, a write address generator that generates a write address A1 for writing the input data to the memory device, wherein the write address A1 is based on an input frame parameter I1, and a read address generator that generates a read address A2 for reading the output data from the memory device, wherein the read address A2 is based on an output frame parameter I2. The device has particular advantageous applicability when the input data stored in the memory is a parity-checked C1-coded signal having a 28-byte frame, and the output data provided by the memory is a C2-coded signal having a 28-byte frame. Preferably, the memory device is a 4Kbyte SRAM having addresses arranged in an array. The write address A1 is further based on an input byte parameter K1 and a row difference parameter D. An initial write address is based on an initial input frame parameter I1=108, an initial input byte parameter K1=0, and an initial row difference parameter D=0. The write address A1 generated by the write address generator is expressed by A1=(I1−D)*28+K1. Likewise, an initial read address is based on an initial output frame parameter I2=109. The read address A2 is further based on the read address A2 generated by the read address generator is expressed by A2=I2*28−1.

BRIEF DESCRIPTION OF THE DRAWINGS

Other objects, features, and advantages of the invention will become apparent upon reading the following detailed description of the preferred but non-limiting embodiments. The description is made with reference to the accompanying drawings, in which.

DESCRIPTION OF THE PREFERRED EMBODIMENT

Figure 1:
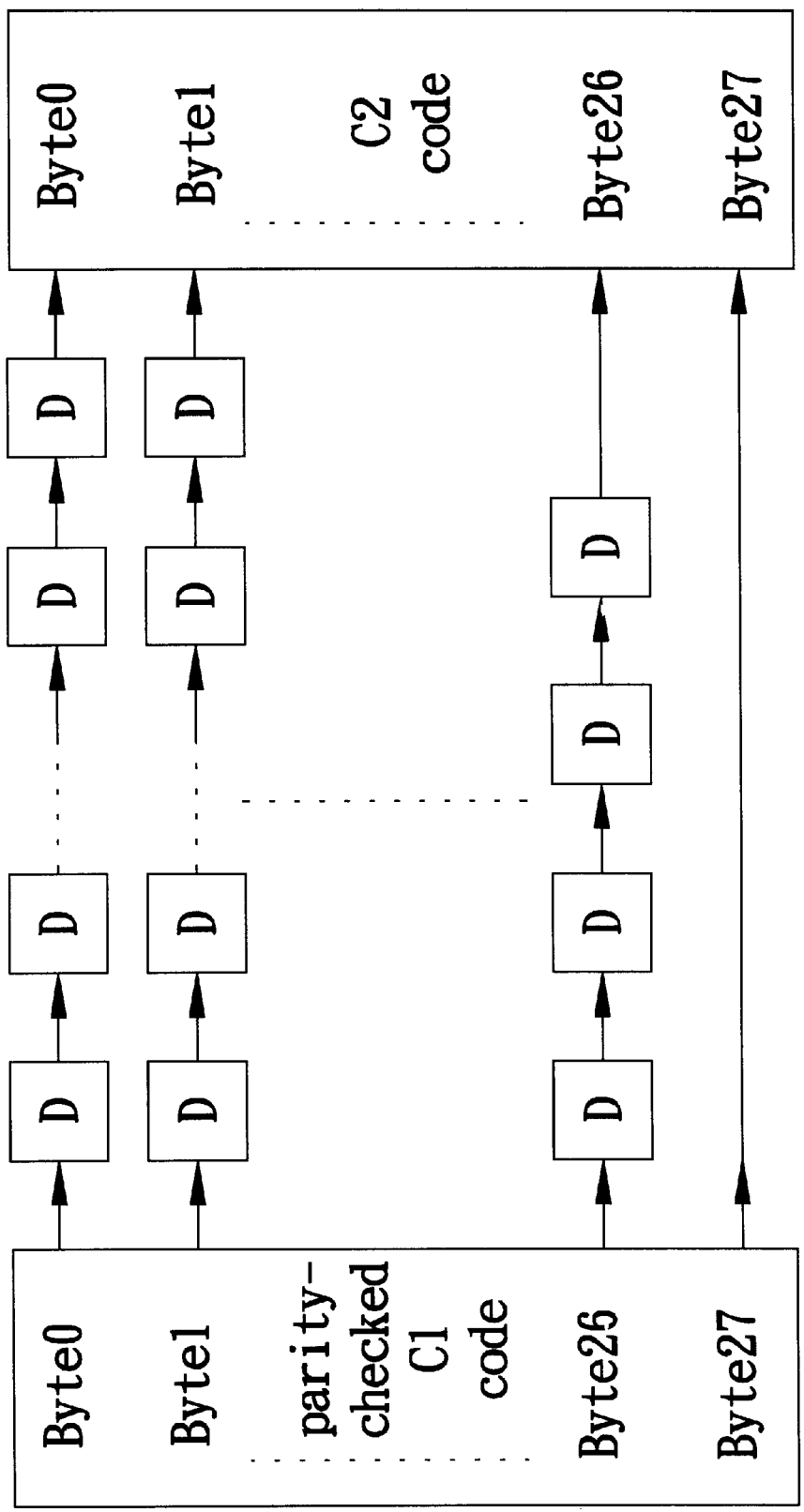
FIG. 1 is a block diagram showing a conventional device for deinterleaving.
Figure 2:
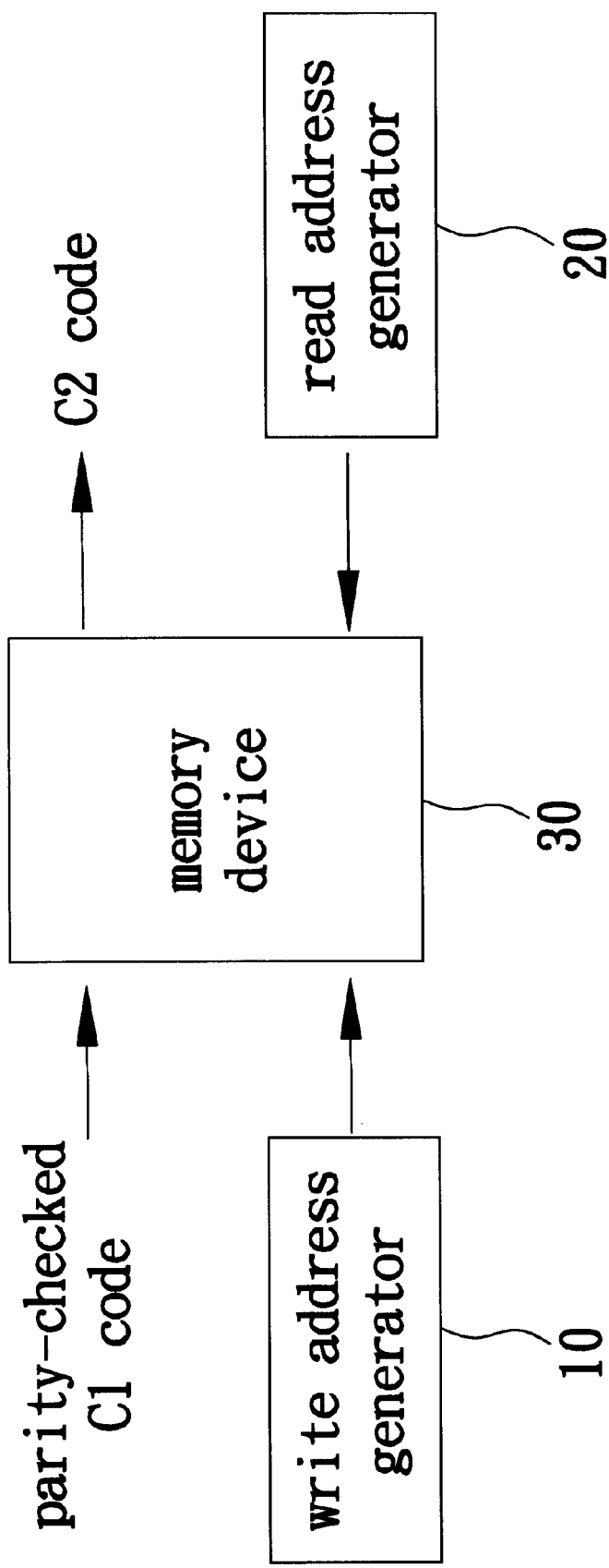
FIG. 2 is a block diagram showing a deinterleaving device according to a preferred embodiment of the present invention.

FIG. 2 is a block diagram showing a deinterleaving device according to a preferred embodiment of the present invention. As shown in FIG. 2, a deinterleaving device of the present invention includes: a write address generator 10, a read address generator 20, and a memory device 30. In the present invention, the memory device 30 can be implemented as, for example, SRAM (Static Random Access Memory) of 4KB. The write address generator 10 generates a write address for writing an input signal into the memory device 30. The input signal in this example is the parity-checked C1 coded data. The read address generator 20 generates a read address for reading an output signal from the memory device 30. The output signal in this example is the C2 coded data.

The parity-checked C1 coded data is written into the memory device 30 according to a write address generated by the write address generator 10. The deinterleaved data is read from the memory device 30 according to a read address generated by the read address generator 20. The steps of writing and reading are respectively shown in FIG. 4 and FIG. 5, which are described later. Through writing the parity-checked C1 coded data and reading the deinterleaved data into/from the memory device 30, the deinterleaving operation is completed.

Figure 3:
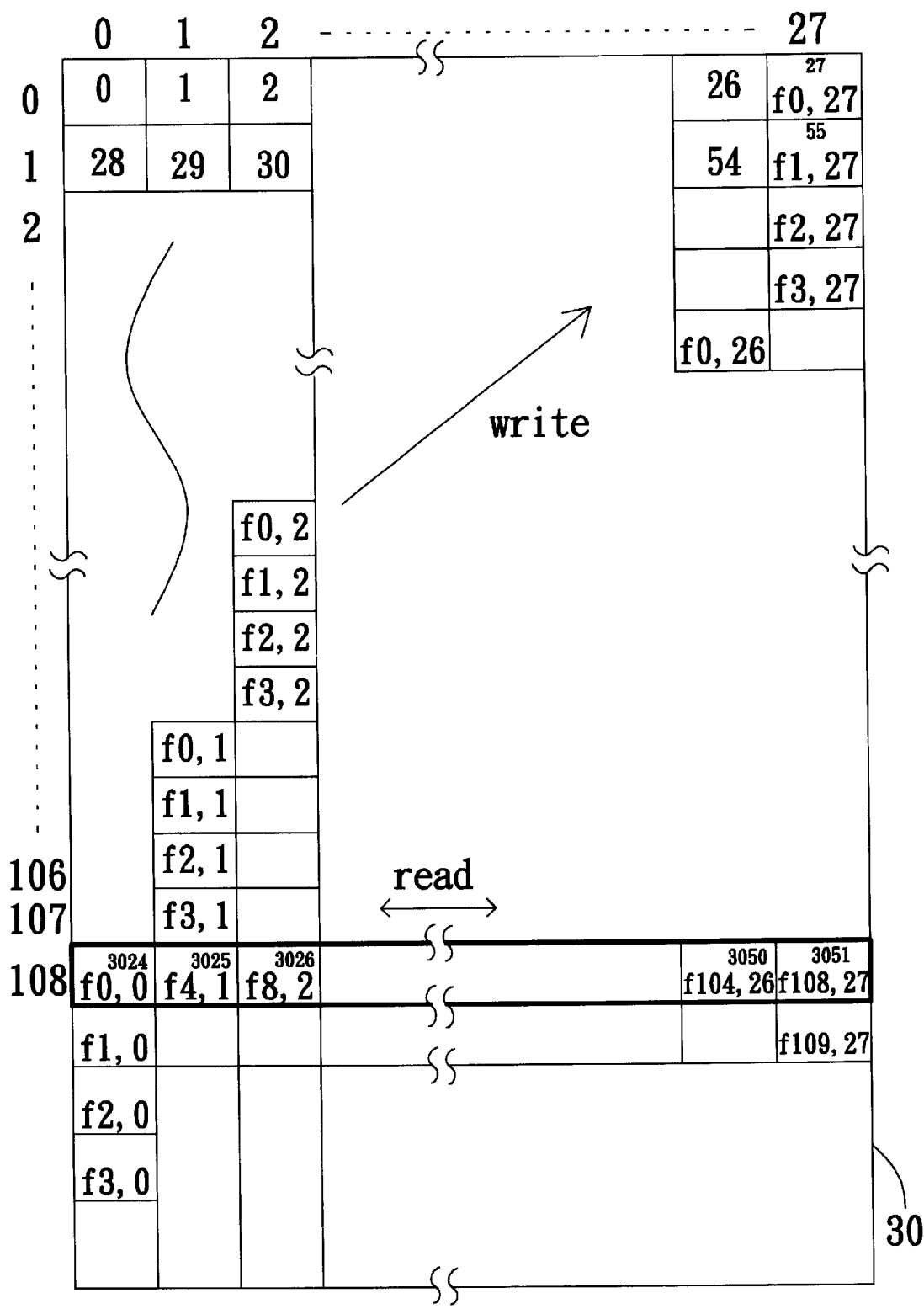
FIG. 3 is an address allocation diagram for a memory device according to the preferred embodiment of the present invention.

FIG. 3 shows the address allocation in the memory device 30 according to the preferred embodiment of the present invention. Parity-checked C1 coded data will be referred to as C1 frames. In FIG. 3, the byte k of C1 frame m is stored at an address denoted by $(f_{m,k})$ All bytes of the first C1 frame 0 are sequentially written into a plurality of addresses denoted $(f_{0,0})$, $(f_{0,1})$, $(f_{0,2})$, ..., $(f_{0,27})$ of the memory device 30, according to the memory array layout of FIG. 3. As depicted in FIG. 3, the writing direction is from lower left to upper right across the columns of the memory device. When the parity-checked C1 coded data is received by the memory device 30, it is stored byte-by-byte for each frame. Similarly, bytes of the C1 frame 1 are sequentially written into a plurality of addresses denoted $(f_{1,0})$, $(f_{1,1})$, $(f_{1,2})$, ..., $(f_{1,27})$ of the memory device 30, again moving across the columns from lower left to upper right. As shown, successive bytes are written into column locations that increment one at a time, whereas the row locations for successive bytes increment in steps of four. By repeating the above writing steps, all C1 frames are written into the memory device 30. As shown in FIG. 3, the addresses of the first row are from 0, 1, 2 . . . to 27, and accordingly, the addresses of the second row are from 28, 29, . . . to 55.

Referring to FIG. 3 again to describe how to read out data from the memory device 30. It is assumed that addressing of the memory device 30 is successive across the array. As described above, writing operations are executed from lower left to upper right. From FIG. 3 it is known the $108^{th}$ row includes $(f_{0,0})$, $(f_{4,1})$, . . . $(f_{108,27})$. As mentioned above, the writing direction is from lower left to upper right. That is to say, if the address $(f_{108,27})$ is written, the other address in the $108^{th}$ row is already written. After the address $(f_{108,27})$ is written, all data stored in the $108^{th}$ row is read out as C2 frame 0. Thus, to assemble C2 frame 0, byte 0 thereof is read from row 108, column 0 $(f_{0,0})$ (byte 0 of C1 frame 0); byte 1 thereof is read from row 108, column 1 $(f_{4,1})$ (byte 1 of C1 frame 4); and so on. After the most right address of the $109^{th}$ row is written, data stored in the $109^{th}$ row is read out as a C2 frame 1. By repeating the above reading steps, all data stored in the memory device 30 is read out as C2 frames.

The following is a description of the steps of writing the C1 frame data into the memory device 30.

Figure 4:
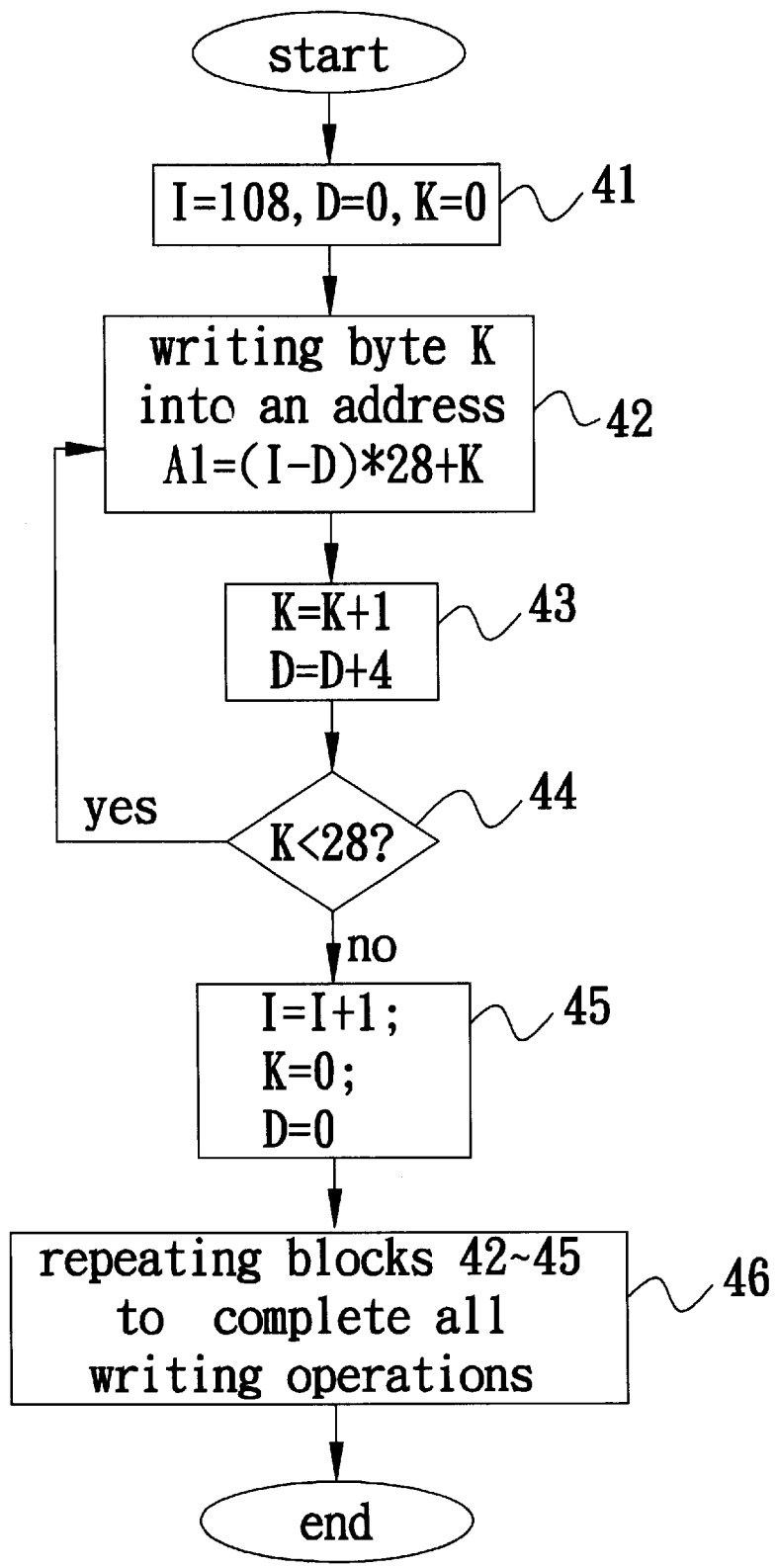
FIG. 4 is a flow chart for a method of writing an input signal into the memory device according to the preferred embodiment of the present invention.

FIG. 4 is a flow chart showing the process of writing the C1 frame into the exemplary memory device 30. First, as shown in block 41, in preparation for writing the C1 frame 0, initial values of a data frame parameter I, a row difference parameter D, and a byte parameter K are respectively set up as 108, 0, and 0. The data frame parameter I corresponds to the C1 frame being written. The byte parameter K represents a byte K of the C1 frame being written. The row difference D represents a cycle difference between the byte K and byte 0. Because the writing operation starts from byte 0, initial values of K and D are both set as 0.

Using the above-defined parameters, a write address A1 of a byte K is represented as A1=(I−D)*28+K, as shown in block 42.

When the byte 0 of C1 frame 0 is to be written, I=108, K=0, D=0. So, a write address A1 thereof is A1=(108−0) *28+0=3024, which corresponds with the first column address in row 108 of a 28-column array. The write address A1 for $(f_{0,0})$ according to the example is shown in FIG. 3.

Then, subsequent bytes of C1 frame 0 are sequentially written. As shown at block 43, for the next byte in frame 0, K=K+1 and D=D+4. That is, because a next byte is to be written, the byte parameter K is increased by 1. The timing delay between adjacent bytes is 4 cycles, so D=D+4.

Then, in block 44, it is identified whether the byte parameter K is less than 28. If the byte parameter K is less than 28, this indicates that not all bytes of the C1 frame are written into the memory device 30 yet. Therefore, blocks 42 and 43 are repeated until K=28, that is, until byte 27 is written. Because there are 28 bytes in a C1 frame, 28 writing operations are required to completely write a C1 frame into the memory device 30. When K=28, it is known that the current C1 frame is completely written into the memory device 30, and that the next C1 frame is to be written.

Then, as shown in block 45, I=I+1 (the data frame parameter is incremented); K=0(the byte parameter is reset); and D=0 (the row difference parameter is reset). That is, the next C1 frame is to be written, beginning with byte 0 and no timing delay.

Then, blocks 42–45 are repeated until all bytes of al C1 frames are completely written into the memory device 30, as shown in block 46.

In this embodiment, the address space in the memory 30 is considered to be continuous. That is to say, if the write address A1, determined by A1=(I−D)*28+K, is greater than the upper bound (e.g., 3583=128*28−1) of the memory device, the write address A1 minus a predetermined number (e.g., upper bound +1=3584) is the new write address A1'. The corresponding byte is then written according to the new write address A1'. Generally stated, if A1 becomes larger than $ADD_{max}$ (the largest allowed address for the memory space), the new write address A1'=A1−($ADD_{max}$+1).

Figure 5:
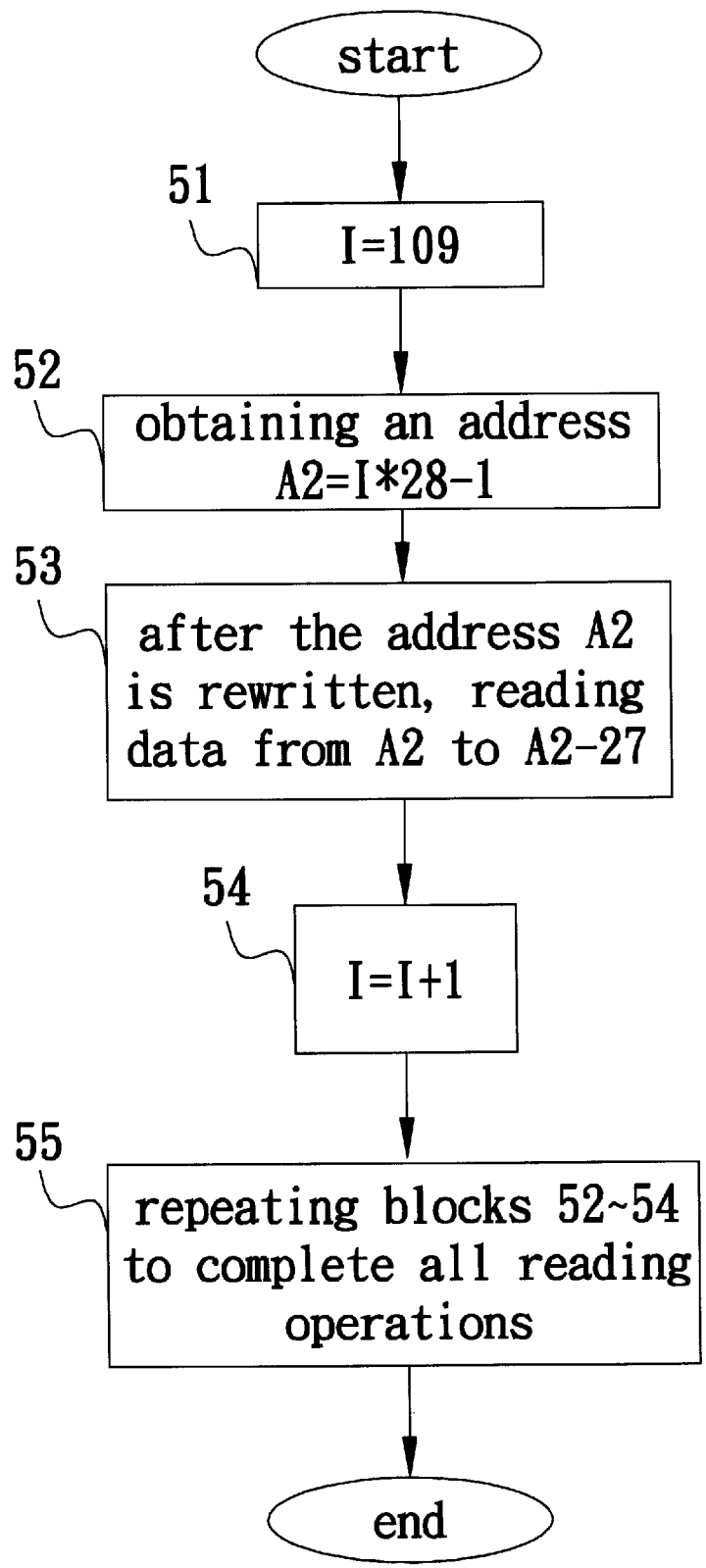
FIG. 5 is a flow chart for reading an output signal from the memory device according to the preferred embodiment of the present invention.

FIG. 5 is a flow chart showing the process of reading data from the memory device. The data frame parameter I here is the same as in FIG. 4. First, an initial value of the data frame parameter I is set to 109 as shown in block 51. Then, two read address A2 and A3 corresponding to the data frame parameter I are obtained by calculating A2=I*28−1 and A3=I*27 as shown in block 52. When I=109, the read address A2 is A2=109*28−1=3051 and A3=109*27=3024. From FIG. 3, it is apparent that the two read address A2 and A3 are respectively the right most address and the left most address of row 108, identified as $f_{108,27}$ and $f_{0,0}$.

Then, in blocks 53, after the address A2 is overwritten, data stored in the remaining addresses in row 108 are read out as a C2 data frame. As stated above, the writing direction was from lower left to upper right. When the right-most address of a row is written, it is known that the other addresses in that row have been written to. Thus, the row data is preferably read from right to left, that is, from higher numbered addresses to lower numbered addresses across the row. Of course, according to the invention, the row data may be read from left to right, but right to left reading is described in this example.

Once the data in a row of memory is read, the next row (frame) is to be read. Thus, in block 54, the row is incremented (I=I+1).

Then, blocks 52–54 are repeated until all C2 frames are read out. Because the address space in the memory device 30 is considered to be continuous, when data stored in the last row of the memory device 30 is read out, the process returns to the first row to read data.

That is, after the last row is read, the frame parameter is reset (I=0).

Reading of the first C2 frame will be described by way of example to describe the timing delay for each byte. A byte 27 of the first C2 frame is read from the memory address indicated as ($f_{108,27}$); a byte 26 of the first C2 frame is read from the memory address indicated as ($f_{104,26}$); . . . and a byte 0 of the first C2 frame is read from the memory address indicated as ($f_{0,0}$). Because the difference parameter was incremented by 4, each time a byte of C1 frame data was written, the read data was offset when stored. This offset represents the timing delay between each byte of 4 cycles. The data stored at ($f_{108,27}$) was the latest written, which means there is no timing delay in reading out byte 27 of the first C1 frame. The data stored at ($f_{0,0}$) was the earliest written data, which means that there are 27×4=108 delay cycles inherent in reading out byte 0 of the first C1 frame as described.

One effect of the present invention is to reduce the hardware cost of a deinterleaving device. According to the present invention, a 4KB SRAM may be used to match the reading speed with the writing speed, when utilizing the disclosed address generators for generating the read address and the write address. The conventional system described previously applies 1512 delay registers, i.e., 44K logic gates. Therefore, the present invention significantly reduces the hardware cost and design time.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

For example, the exemplary embodiment featured a memory device having 28 columns, for receiving 28-byte wide frames of data. The device and method of the invention may be adapted to accommodate data of any length. Further, the difference parameter D was incremented in steps of 4, to account for delays of four clock periods in the interleaving process. This parameter, of course may be incremented by any amount necessary to suit the particular interleaving system. Still further, the delay was accounted for by utilizing a difference parameter D to provide an offset during the write process. Alternatively, the data may be written sequentially across the rows of the memory device, and the difference parameter D may be applied instead during the read process, within the scope of the invention.

What is claimed is:

1. A method of deinterleaving bytes of a framed input signal to provide a deinterleaved framed output signal, comprising:

generating a write address A1;

receiving sequential bytes of the input signal;

storing the received bytes as write data, according to the write address A1;

generating a read address A2; and producing the output signal as sequential bytes of read data, according to the read address A2;

wherein generating a write address A1 includes
setting initial values of input parameters, which correspond to characteristics of a current received byte,
generating an initial write address based on the initial values of the input parameters,
changing the values of ones of the input parameters to correspond to a next received byte, and
repeatedly generating the write address A1 based on the changed values of the input parameters;

wherein storing the received bytes as write data includes sequentially writing each of the received bytes to a respective memory address corresponding to the write address A1;

wherein generating a read address A2 includes
setting initial values of output parameters, which correspond to characteristics of a current byte of read data,
generating an initial read address based on the initial values of the output parameters,
changing the values of ones of the output parameters after each byte of read data is provided, and
repeatedly generating the read address A2 based on the changed values of the output parameters; and wherein providing the output signal as bytes of read data includes reading sequential bytes of the read data from a memory address corresponding to the read address A2.

2. A method according to claim 1, wherein the input parameters include a first input parameter I1, a second input parameter K1, and a third input parameter D, wherein the first input parameter I1 corresponds to a frame identification of a current received byte, the second input parameter K1 corresponds to a byte identification of the current received byte, and the third input parameter D corresponds to a delay identification of the current received byte.

3. A method according to claim 2, wherein the output parameters include a output parameter I2, wherein the output parameter I2 corresponds to a frame identification of a current byte of read data.

4. A method according to claim 3, wherein an initial value of the first output parameter I2 corresponds to a number that is 1 greater than the number of frames in the output signal.

5. A method according to claim 3, herein generating the read address A2 includes accessing a memory location corresponding to A2=I2*B−1, wherein B corresponds to a number of bytes in a frame of the output signal.

6. A method according to claim 3, wherein changing the value of the output parameter to correspond to a next byte of read data, and repeatedly generating the read address A2 based on the changed value of the output parameter, includes generating the read address A2 such that A2=I2*B−1, wherein B corresponds to a number of bytes in a frame of the output signal, changing the parameter such that I2=I2+1, and generating a next read address A2 based on the changed parameter I2.

7. A method according to claim 2, wherein an initial value of the first input parameter I1 corresponds to the number of frames in the input signal.

8. A method according to claim 2, wherein an initial value of the second input parameter K1 corresponds to the first byte of the input signal.

9. A method according to claim 2, wherein an initial value of the third input parameter D corresponds to an initial interleave delay between bytes in a frame of the input signal.

10. A method according to claim 2, wherein changing the values of ones of the input parameters to correspond to a next received byte, and repeatedly generating the write address A1 based on the changed values of the input parameters, includes generating the write address A1 such that A1=(I1−D)*B+ K1, wherein B corresponds to a number of bytes in a frame of the input signal, changing the parameters such that K1=K1+1 and D=D+N, where N corresponds to a number of clock cycle interleave delay units between bytes of the input signal, and generating a next write address A1 based on the changed parameters if K1<B.

11. A method according to claim 10, further comprising changing the parameters such that the first input parameter I1 is incremented, the second input parameter K1 is reset to an initial first input parameter value, and the third input parameter D is reset to an initial second input parameter value, when K1=B.

12. A method according to claim 1, wherein the input signal is a parity-checked C1-coded signal having a 28-byte frame.

13. A method according to claim 12, wherein the output signal is a C2-coded signal having a 28-byte frame.

14. A method of deinterleaving bytes of a framed input signal to provide a deinterleaved framed output signal, comprising:

generating a write address A1;

storing the input signal as bytes of write data, according to the write address A1;

generating a read address A2; and providing the output signal as bytes of read data, according to the read address A2;

wherein generating a write address A1 includes setting initial values of an input frame parameter I1, an input byte parameter K1, and a row difference parameter D, generating an initial write address based on the initial values of the input frame parameter I1, the input byte parameter K1, and the row difference parameter D, changing the values of ones of the input frame parameter I1, the input byte parameter K1, and the row difference parameter D after each byte of write data is stored, and repeatedly generating the write address A1 based on the changed values of the input frame parameter I1, the input byte parameter K1, and the row difference parameter D;

wherein storing the input signal as bytes of write data includes writing sequential bytes of the input signal to a memory address corresponding to the write address A1;

wherein generating a read address A2 includes setting initial values of an output frame parameter I2, generating an initial read address based on the initial values of the output frame parameter I2, changing the value of the output frame parameter I2 after each byte of read data is provided, and repeatedly generating the read address A2 based on the changed values of the output frame parameter I2; and wherein providing the output signal as bytes of read data includes reading sequential bytes of the read data from a memory address corresponding to the read address A2.

15. A method according to claim 14, wherein generating the read address A2 includes accessing a memory location corresponding to A2=I2*28−1.

16. A method according to claim 15, wherein changing the value of the output frame parameter I2 after each byte of read data is provided, and repeatedly generating the read address A2 based on the changed values of the output frame parameter I2 includes generating the read address A2 such that A2=I2*28−1.

17. A method according to claim 16, further comprising changing the parameter such that I2=I2+1.

18. A method according to claim 14, wherein the input signal is a parity-checked C1-coded signal having a 28-byte frame.

19. A method according to claim 18, wherein the output signal is a C2-coded signal having a 28-byte frame.

20. A method according to claim 14, wherein writing sequential bytes of the input signal to a memory address includes writing to an array memory.

21. A method according to claim 20, wherein the array memory is an SRAM.

22. A method according to claim 14, wherein the initial values of the input frame parameter I1, the row difference parameter D and the input byte parameter K1 are respectively 108, 0 and 0.

23. A method according to claim 22, wherein changing the values of ones of the input frame parameter I1, the input byte parameter K1, and the row difference parameter D after each byte of write data is stored, and repeatedly generating the write address A1 based on the changed values of the input frame parameter I1, the input byte parameter K1, and the row difference parameter D includes generating the write address A1 such that A1=(I1−D)*28+ K1, changing the parameters such that K1=K1+1 and D=D+4, and generating a next write address A1 based on the changed parameters if K1<28.

24. A method according to claim 23, further comprising changing the parameters such that I1=I1+1, D=0, and K1=0, when K1=28.

25. A method according to claim 14, wherein the initial value of the output frame parameter I2=109.

26. A decoding device for deinterleaving bytes of framed input data, comprising:

a memory device that stores the input data and provides output data;

a write address generator that generates a write address A1 for writing the input data to the memory device, wherein the write address A1 is based on an input frame parameter I1, an input byte parameter K1 and a row difference parameter D; and a read address generator that generates a read address A2 for reading the output data from the memory device, wherein the read address A2 is based on an output frame parameter I2.

27. A decoding device according to claim 26, wherein an initial write address is based on an initial input frame parameter I1=108, an initial input byte parameter K1=0, and an initial row difference parameter D=0.

28. A decoding device according to claim 27, wherein the write address A1 generated by the write address generator is expressed by A1=(I1−D)*28+K1.

29. A decoding device for deinterleaving bytes of framed input data, comprising:

a memory device that stores the input data and provides output data;

a write address generator that generates a write address A1 for writing the input data to the memory device, wherein the write address A1 is based on an input frame parameter I1 and wherein an initial read address is based on an initial output frame parameter I2=109; and a read address generator that generates a read address A2 for reading the output data from the memory device, wherein the read address A2 is based on an output frame parameter I2.

30. A decoding device according to claim 29, wherein the read address A2 generated by the read address generator is expressed by A2=I2*28−1.

* * * * *